United States Patent
Kakinuma

(10) Patent No.: US 6,579,422 B1
(45) Date of Patent: Jun. 17, 2003

(54) METHOD AND APPARATUS FOR MANUFACTURING FLEXIBLE ORGANIC EL DISPLAY

(75) Inventor: Masayasu Kakinuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/786,609

(22) PCT Filed: Jul. 7, 2000

(86) PCT No.: PCT/JP00/04551

§ 371 (c)(1),
(2), (4) Date: Mar. 6, 2001

(87) PCT Pub. No.: WO01/05194

PCT Pub. Date: Jan. 18, 2001

(30) Foreign Application Priority Data

Jul. 7, 1999  (JP) .......................................... 11-192928

(51) Int. Cl.[7] ......................... C23C 14/34; B05C 11/00; B05D 5/06
(52) U.S. Cl. ............................ 204/192.13; 204/192.12; 204/298.03; 204/298.11; 204/298.24; 204/298.26; 118/665; 118/712; 118/718; 118/719; 427/8; 427/66; 427/64; 427/69; 427/109; 427/255.5
(58) Field of Search ..................... 204/192.12, 192.13, 204/298.11, 298.03, 298.23, 298.24, 298.26; 118/665, 712, 714, 715, 718; 427/8, 66, 64, 69, 109, 255.5

(56) References Cited

U.S. PATENT DOCUMENTS

| 4,915,898 A | * | 4/1990 | Wolff et al. | 419/3 |
| 5,817,366 A | | 10/1998 | Arai et al. | 427/66 |
| 5,904,961 A | | 5/1999 | Tang et al. | 427/501 |

FOREIGN PATENT DOCUMENTS

| EP | 0865229 A2 | 9/1998 | H05B/31/10 |
| JP | 63152896 | 6/1988 | H05B/33/10 |
| JP | 7153574 | 6/1995 | H05B/33/14 |
| JP | 10140344 | 5/1998 | C23C/14/35 |
| JP | 10298738 | 11/1998 | C23C/14/04 |
| JP | 1131586 | 2/1999 | H05B/33/22 |
| JP | 2000150150 | 5/2000 | H05B/33/10 |

OTHER PUBLICATIONS

Computer translation of JP 2000–150150.*
Computer translation of JP 11–31586.*
Computer translation of JP 10–298738.*
Computer translation of JP 10–140344.*
Computer translation of JP 7–153574.*

* cited by examiner

Primary Examiner—Steven H. VerSteeg
(74) Attorney, Agent, or Firm—Sonnenschein, Nath & Rosenthal

(57) ABSTRACT

A whole organic EL display fabricating apparatus is provided inside a vacuum chamber. In this case, a first patterning unit B through a third patterning unit D for sequentially forming luminescent layer patterns of GREEN, BLUE, and RED on an anode pattern on a strip-shaped flexible substrate 1, and a fourth patterning unit E for forming a cathode pattern on the subsequent stage are provided. The first patterning unit B is provided with a first cooling can 21 and a vacuum vapor deposition unit below for forming the luminescent layer pattern of GREEN. The structures of the second patterning unit through the fourth patterning unit are similar to that of the first patterning unit. In fabricating a display, the substrate 1 is caused to travel from the first cooling can 21 toward a fourth cooling can 64 by the roll-to-roll system.

20 Claims, 5 Drawing Sheets

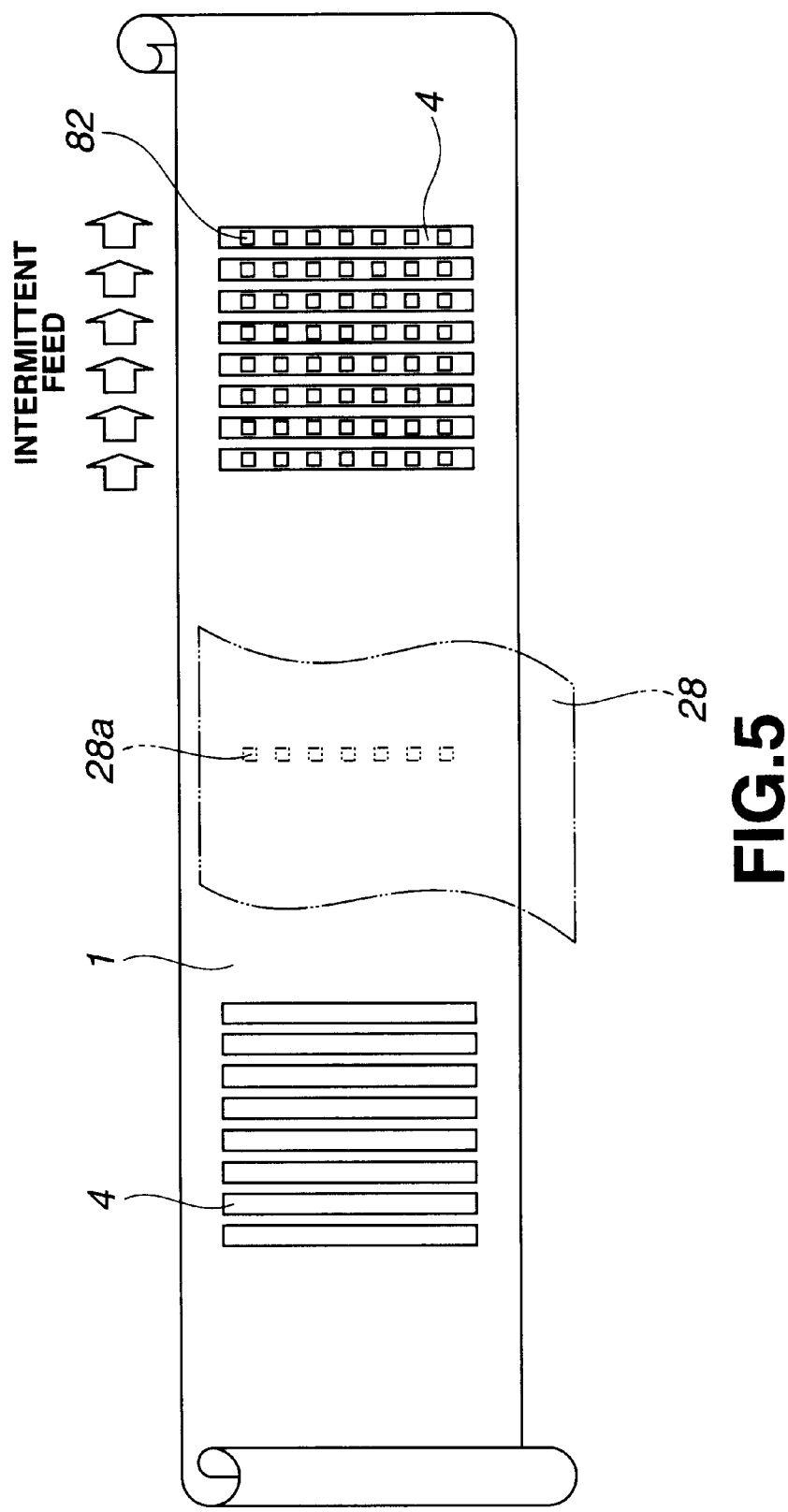

METHOD AND APPARATUS FOR MANUFACTURING FLEXIBLE ORGANIC EL DISPLAY

This application claims priority to PCT Application No. PCT/JP00/04551, filed Jul. 7, 2000, which claims the benefit of Japanese Application No. 11-192928, filed Jul. 7, 1999. Both PCT Application No. PCT/JP00/04551 and Japanese Application No. 11-192928 are incorporated herein by reference to the extent permitted by law.

1. Technical Field

This invention relates to a method and apparatus for fabricating an organic EL (electroluminescence) display utilized as a panel light source, a display panel or the like, and particularly to a method and apparatus which enables continuous and efficient fabrication of a flexible organic EL display having a cathode, a luminescent layer made of an organic substance and an anode on an optically flexible substrate.

2. Background Art

An organic EL element is an element of a thin film type having a first electrode (anode or cathode) formed on a substrate, an organic layer (single layer portion or organic multilayer portion), that is, a luminescent layer, containing an organic luminescent substance stacked thereon, and a second electrode (cathod or anode) stacked on the luminescent layer. In this organic EL element, the organic luminescent substance is caused to emit light by applying a predetermined voltage between the first electrode and the second electrode.

Since the organic EL element is an element of a thin film type as described above, when an organic EL panel having a single or a plurality of organic EL elements formed on the substrate is used as a panel light source of black light or the like, an apparatus having the panel light source can be easily thinned. Moreover, when a display device is constituted by using, as a display panel, an organic EL panel having a predetermined number of organic EL elements as pixels formed on a substrate, advantages that cannot be provided by a liquid crystal display device are realized such as high visibility and absence of field angle dependency.

However, in the case of fabricating an organic EL element, there remain many technical problems and it is generally difficult to finely pattern the cathode or the luminescent layer (organic EL medium layer) of the organic EL element because of the poor heat resistance (in general, 100° C. or lower), low solvent resistance and poor moisture resistance of the organic substance (organic EL medium) used for a charge injection layer and a luminescent layer. For example, it is very difficult to use a photolithography method, which is normally used for patterning of a thin film, for the organic EL element because there is a problem of deteriorating characteristics of the organic EL element due to the entry of a solvent in a photoresist into the element, the high-temperature atmosphere in a resist baking step, the entry of a resist developer solution or an etching solution into the element, the damage by plasma in dry etching and the like.

As a technique for solving the foregoing problems, an organic EL panel having little deterioration in an organic EL element and having high reliability and a fabrication method therefor are disclosed in the Japanese Publication of Unexamined Patent Application No. H9-102393.

As a technique for inexpensive and efficient mass production of organic EL displays as described in the above-mentioned publication, a method and apparatus of a so-called roll-to-roll system may be considered. However, this technique has not been sufficiently studied yet, and considerably complicated steps and device structure are required for fabricating a flexible organic EL display by the roll-to-roll system. For example, in the current state, it is quite difficult to pattern a cathode or a luminescent layer for the organic EL element at a low cost on a substrate of a large area made of a plastic film or the like.

DISCLOSURE OF THE INVENTION

Thus, it is an object of the present invention to provide a method and apparatus for fabricating an organic EL display by the roll-to-roll system, which enables continuous and efficient mass production of flexible organic EL displays.

In order to achieve the above-described object, a method for fabricating a flexible organic EL display according to a first aspect of the present invention is adapted for fabricating an organic EL display having a cathode, a single or a plurality of luminescent layers made of an organic substance, and an anode provided on an optically transparent substrate, wherein a strip-like flexible substrate made of a plastic film or the like is used as the optically transparent substrate, and a step of patterning the luminescent layer and a step of patterning the cathode are carried out in a vacuum by a roll-to-roll system while making the flexible substrate travel continuously.

As the luminescent layer patterning step according to the first aspect of the present invention, it is preferred to pattern the luminescent layer on the surface of the flexible substrate on which the anode is patterned in advance and to clean the surface of the flexible substrate by ion bombardment immediately before the luminescent layer patterning step.

Also, according to the first aspect of the present invention, it is preferred that at least one of the luminescent layer patterning step and the cathode patterning step is carried out by vacuum vapor deposition or sputtering using a mask having an opening portion of a predetermined shape formed therein, and is adapted for forming a stripe pattern having a width equal to the width of the opening portion on the flexible substrate.

Moreover, according to the first aspect of the present invention, it is preferred that as the mask, a strip-like mask having opening portions intermittently formed therein is caused to intermittently travel by the roll-to-roll system at every predetermined travelling length of the flexible substrate in accordance with the roll-to-roll system, and that the opening portions which are reeled out are caused to face a generation source of a patterning substance in the luminescent layer patterning step and the cathode patterning step.

Furthermore, according to the first aspect of the present invention, it is preferred that a tracking signal is provided on one lateral end portion of the flexible substrate, the position in the longitudinal direction and the direction of the width of the flexible substrate is detected by detecting the tracking signal, and the position of the opening portion formed in the mask and the opening and closing timing of a shutter for starting and stopping the supply of the patterning substance to the flexible substrate are controlled on the basis of the result of detection.

In addition, according to the first aspect of the present invention, it is preferred that the flexible substrate processed in the luminescent layer patterning step and the cathode patterning step is wound in a roll shape and that the roll is housed in a container filled with an inert gas and is carried to the next step.

In order to achieve the above-described object, a method for fabricating a flexible organic EL display according to a second aspect of the present invention is adapted for fabricating an organic EL display having a cathode, a single or a plurality of luminescent layers made of an organic substance, and an anode provided on an optically transparent substrate, wherein a strip-like flexible substrate made of a plastic film or the like is used as the optically transparent substrate, and a step of patterning the luminescent layer and a step of patterning the cathode are carried out in a vacuum by a roll-to-roll system while making the flexible substrate travel intermittently.

In order to achieve the above-described object, an apparatus for fabricating a flexible organic EL display according to a third aspect of the present invention is adapted for fabricating an organic EL display having a cathode, a single or a plurality of luminescent layers made of an organic substance, and an anode provided on an optically transparent flexible substrate made of a plastic film or the like, wherein a step of patterning the luminescent layer and a step of patterning the cathode onto the surface of a strip-like optically transparent flexible substrate are carried out in a vacuum by a roll-to-roll system while making the flexible substrate travel continuously.

According to the third aspect of the present invention, it is preferred to provide an ion cleaning electrode for cleaning the surface of the flexible substrate by ion bombardment immediately before the luminescent layer patterning step.

Also, according to the third aspect of the present invention, it is preferred that at least one of the luminescent layer patterning step and the cathode patterning step is carried out by vacuum vapor deposition or sputtering using a mask, and that the apparatus includes a continuously rotating drum for winding the flexible substrate thereon and causing the flexible substrate to travel, a generation source of a patterning substance, and a mask arranged between the continuously rotating drum and the patterning substance generation source and having an opening portion of a predetermined shape formed therein.

Moreover, according to the third aspect of the present invention, it is preferred that the apparatus includes travelling means for causing a strip-like mask, having opening portions intermittently formed therein to intermittently travel by the roll-to-roll system at every predetermined travelling length of the flexible substrate in accordance with the roll-to-roll system, and that the opening portions reeled out by the travelling means are caused to face the generation source of the patterning substance.

Furthermore, according to the third aspect of the present invention, it is preferred that the apparatus includes a tracking signal provided on one lateral end portion of the flexible substrate and a tracking signal detection sensor for detecting the tracking signal, and that the position in the longitudinal direction and the direction of the width of the flexible substrate is detected by detecting the tracking signal using the tracking signal detection sensor, and the position of the opening portion formed in the mask and the opening and closing timing of a shutter for starting and stopping the supply of the patterning substance to the flexible substrate are controlled on the basis of the result of detection.

In addition, according to the third aspect of the present invention, it is preferred that the apparatus includes winding means for winding in a roll the flexible substrate, processed in the luminescent layer patterning step and the cathode patterning step, and a container filled with an inert gas for housing the roll.

Further, according to the third aspect of the present invention (FIGS. 1 and 2), it is preferred that a travelling counter 12 for counting the travelling distance of a flexible substrate 1 and an anode pattern edge detection sensor 27 for detecting an edge 4a of an anode stripe pattern 4 (having streak-shaped anode patterns formed in a plurality of rows along the direction of width of the flexible substrate 1) are provided in the luminescent layer patterning step constituting the apparatus for fabricating a flexible organic EL display, and that a shutter 24 for starting and stopping the supply of the patterning substance to the flexible substrate 1 and a shutter controller 25 for controlling the opening and closing of the shutter 24 are provided in a patterning substance generation source (evaporation source) 23, wherein the travelling counter 12 and the anode pattern edge detection sensor 27 are caused to communicate with the shutter controller 25 and wherein patterning from a front end portion to a rear end portion of the anode stripe pattern 4 along the substrate travelling direction is carried out by controlling the opening and closing of the shutter 24 in the luminescent layer patterning step.

Moreover, according to the third aspect of the present invention (FIGS. 1 and 2), it is preferred that the luminescent layer patterning step for forming a luminescent layer pattern 6 (and 7) of another color in parallel with and distanced away at an appropriate space from a luminescent layer pattern 5 in the flexible substrate 1 having the anode stripe pattern 4 formed in the direction of width of the flexible substrate 1 and having the luminescent layer stripe pattern 5 of a predetermined color orthogonal to the anode pattern 4, or the cathode patterning step for stacking a stripe pattern 8 of a cathode 8a on luminescent layer stripe patterns 5, 6, 7 in the flexible substrate 1 having the anode stripe pattern 4 formed in the direction of width of the flexible substrate 1 and having the luminescent layer stripe patterns 5, 6, 7 of predetermined colors formed on the anode pattern 4, is constituted as follows.

That is, it is preferred that a travelling counter 12 for counting the travelling distance of the flexible substrate 1, an anode pattern edge detection sensor 27 for detecting an edge 4a of the anode stripe pattern 4, luminescent layer pattern edge detection sensors 42, 52, 62 for detecting edges 5a, 6a, 7a of the luminescent layer patterns 5, 6, 7, a mask width position controller 45 for adjusting the position of a mask 28 in the direction of width of the flexible substrate, and an edge position controller 41 for correcting meandering of the flexible substrate 1 on the continuously rotating drum (for example, first cooling can 21) are provided. It is also preferred that the anode pattern edge detection sensor 27 is caused to communicate with a shutter controller 25, the travelling counter 12 is caused to communicate with the shutter controller 25 and the mask width position controller 45, and the luminescent layer pattern edge detection sensor 42 is caused to communicate with the mask width position controller 45. It is also preferred that a shutter 24 for starting and stopping the supply of the patterning substance to the flexible substrate, and the shutter controller 25 for controlling the opening and closing of the shutter 24 are provided in the patterning substance generation source.

In order to achieve the above-described object, an apparatus for fabricating a flexible organic EL display according to a fourth aspect of the present invention is adapted for fabricating an organic EL display having a cathode, a single or a plurality of luminescent layers made of an organic substance, and an anode provided on an optically transparent flexible substrate made of a plastic film or the like, wherein a step of patterning the luminescent layer and a step of patterning the cathode onto the surface of a strip-like optically transparent flexible substrate are carried out in a vacuum by a roll-to-roll system while making the flexible substrate travel intermittently.

BRIEF DESCRIPTION OF THE DRAWINGS

FIG. 5 shows the state where a dot-like pattern is formed by intermittently feeding a film substrate in the fabricating apparatus of FIG. 1.

BEST MODE FOR CARRYING OUT THE INVENTION

Preferred embodiments of the present invention will now be described with reference to the drawings.

Figure 1:
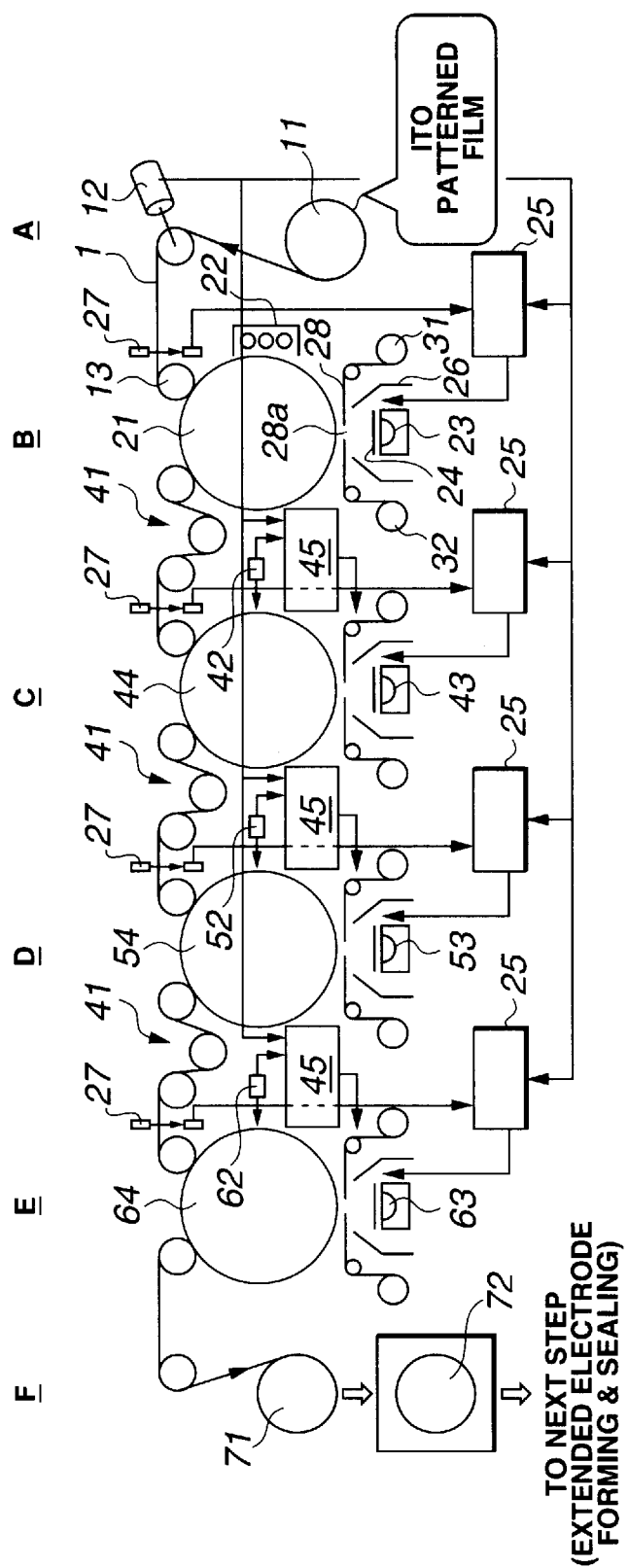
FIG. 1 is an explanatory view showing the structure of a flexible organic EL display fabricating apparatus according to an embodiment of the present invention.

FIG. 1 is an explanatory view showing the structure of a flexible organic EL display fabricating apparatus. FIGS. 2(a) to 2(e) are plan views showing the state where respective patterns are sequentially formed on an optically transparent and flexible plastic film substrate by the fabricating apparatus, and are plan views showing the substrate portion immediately after respective steps. The display fabricating apparatus is housed in a vacuum chamber (not shown) and is adapted for continuously carrying out formation (patterning) of the patterns in a vacuum by the roll-to-roll system.

Specifically, the display fabricating apparatus includes a reeling unit A for a plastic film substrate 1 having ITO anodes 2 and extended electrodes 3 patterned in advance in a stripe shape on its surface, a first patterning unit B (first vapor deposition unit) for patterning a luminescent layer of GREEN on the ITO anodes 2 by vapor deposition, a second patterning unit C (second vapor deposition unit) for patterning a luminescent layer of BLUE in parallel with the luminescent layer of GREEN by vapor deposition, a third patterning unit D (third vapor deposition unit) for similarly patterning a luminescent layer of RED in parallel with the luminescent layer of GREEN by vapor deposition, a fourth patterning unit E (electrode patterning film forming unit) for patterning cathodes 8a in a stacked state by vapor deposition (or sputtering) on both end portions of the luminescent layers of three colors, and a winding unit F for winding the substrate 1 from the fourth patterning unit.

FIG. 2(a) shows the substrate 1 having the ITO anodes 2 and the extended electrodes 3 patterned in advance in a stripe shape on its surface. FIG. 2(b) shows the substrate immediately after the luminescent layer of GREEN is patterned in a stripe shape. FIG. 2(c) shows the substrate immediately after the luminescent layer of BLUE is patterned in a stripe shape. FIG. 2(d) shows the substrate immediately after the luminescent layer of RED is patterned in a stripe shape. FIG. 2(e) shows the substrate immediately after the cathodes are patterned.

On the surface of the strip-shaped film substrate 1 shown in FIG. 2(a), a plurality of electrode patterns 4, each comprising the ITO electrode 2 constituting a transparent conductive film as the anode and the extended electrodes 3 continuous to both end portions thereof, are formed at an equal pitch in the longitudinal direction of the substrate and orthogonal to the longitudinal direction. The fabricating apparatus is adapted for ultimately stacking stripe patterns 5, 6, and 7 of GREEN, BLUE, and RED on and orthogonal to the electrode patterns 4 and then stacking the cathode stripe pattern 8 on the stripe patterns of three colors in a combined manner, as shown in FIG. 2(e).

As is apparent from FIG. 2(e), in the flexible organic EL display to be formed, the stripe patterns 5 to 7 of three colors and the cathode stripe pattern 8 are stacked with high accuracy on the electrode patterns 4 which are intermittently formed on the substrate 1. Therefore, the flexible organic EL display fabricating apparatus according to the present invention needs to have pattern forming means therefor and control means for controlling the operation. The structure of the fabricating apparatus will now be described.

The reeling unit A is provided with a reeling shaft 11 for setting the film substrate 1 on which the ITO anodes 2 and the extended electrodes 3 stacked on both end portions of the ITO anodes 2 in a combined manner are patterned in a stripe shape, and a travelling counter 12 for counting the travelling distance of the film substrate 1 reeled out from the reeling shaft 11.

As shown in FIG. 2(b), the first patterning unit B is adapted for carrying out patterning of GREEN from the front end portion to the rear end portion of the electrode patterns 4 in the substrate travelling direction. The first patterning unit B is provided with a first cooling can 21, which is a continuously rotating cylindrical drum. Near the outer peripheral surface of the first cooling can 21, there are provided an ion cleaning electrode 22, an evaporation source 23 for forming the luminescent layer of GREEN on the film substrate 1, a shutter 24 for opening and closing a vapor supply port of the evaporation source 23, a shutter controller 25 for controlling the opening and closing of the shutter 24, and a shield plate 26 in the shape of an inverted cone (with its supper portion opened) for surrounding the outer periphery of the evaporation source 23. The opening portion of the shield plate 26 is located closely to the first cooling can 21 so that a strip-shaped mask 28 can intermittently travel in the gap between the opening portion and the first cooling can 21. In the mask 28, opening portions 28a are intermittently formed in the longitudinal direction of the mask. The ion cleaning electrode 22 is adapted for cleaning, by ion bombardment, the surface of the film substrate 1 travelling in close contact with the outer peripheral surface of the cooling can 21 immediately before the luminescent layer patterning step by the first patterning unit B.

An intermittent travelling device for the mask 28 is adapted for feeding to index the mask 28 and locating the next opening portion 28a right above the evaporation source 23 as shown in FIG. 1, when an adhered object is adhered to the mask 28 to a certain extent by vapor deposition for a long period of time. This intermittent mask travelling device is provided with a reeling shaft 31 for setting the mask 28 and a winding shaft 32 for winding the mask 28 reeled out from the reeling shaft 31. The mask 28 is caused to intermittently travel at every predetermined travelling length of the film substrate 1 by rotating the winding shaft 32, and the opening portion 28a thus reeled out is caused to face the evaporation source 23. An anode pattern edge detection sensor 27 for detecting an edge 4a of the electrode pattern 4 patterned in the previous step is provided before the first cooling can 21, so that an output signal thereof can be transmitted to the shutter controller 25. The travelling counter 12 and the anode pattern edge detection sensor 27 are caused to communicate with the shutter controller 25.

The second patterning unit C is adapted for carrying out patterning of BLUE from the front end portion to the rear end portion of the electrode patterns 4 in the substrate travelling direction, in parallel with and in proximity with the pattern of GREEN. The second patterning unit C is provided with an edge position controller 41 (EPC(edge positioning control)mechanism) for correcting the meandering of the film substrate 1 on a second cooling can 44, a luminescent layer pattern edge detection sensor 42 for detecting an edge of the luminescent layer pattern 5, and a mask width position controller 45 for adjusting the position of the mask 28 in the direction of width of the film substrate. In place of the evaporation source 23, an evaporation source 43 for forming the luminescent layer of BLUE is provided. The other parts of the structure are similar to those of the first patterning unit B. The anode pattern edge detection sensor 27 is caused to communicate with the shutter controller 25, and the travelling counter 12 is caused to communicate with the shutter controller 25 and the mask width position controller 45.

The third patterning unit D is provided with an evaporation source 53 for forming the luminescent layer of RED, in place of the evaporation source 43. The other parts of the structure are similar to those of the second patterning unit C. The fourth patterning unit E is provided with an evaporation source 63 (or sputtering source) for forming the cathode pattern, in place of the evaporation source 53, and the other parts of the structure are similar to those of the third patterning unit D. The winding unit F is provided with a winding shaft 71 for winding the substrate 1 from the fourth patterning unit E. In the winding unit F, an $N_2$ purge box 72 for carrying the wound substrate 1 in a roll shape to the next step is prepared. Inside the $N_2$ purge box 72, nitrogen replacement is carried out in advance and nitrogen replacement of the inside can be carried out again after the rolled substrate 1 is housed therein.

Numerals 52 and 62 in FIG. 1 denote the luminescent layer pattern edge detection sensors. A numeral 54 denotes a third cooling can, and a numeral 64 denotes a fourth cooling can. These cooling cans are provided with a mechanism similar to that of the ion cleaning electrode 22 in a similar manner. The first cooling can 21 through the fourth cooling can 64 are rotary cooling drums for preventing thermal deformation of the flexible substrate 1.

The operation of the display fabricating apparatus will now be described further in detail. As shown in FIG. 2(a), the electrode patterns 4 comprising the ITO anodes 2 as transparent conductive films and the extended electrodes 3 are patterned on the plastic film substrate 1 in the preceding step. For this patterning, for example an ordinary photolithography method or other method can be employed. The film substrate 1 on which the ITO anodes 2 are already patterned is set on the reeling shaft 11 of the apparatus of FIG. 1. The substrate 1 reeled out from the reeling shaft 11 passes through several guide rolls 13, then is wound onto the first cooling can 21, and is caused to continuously travel from the right side to the left side of FIG. 1 by the rotation of the cooling can.

The first cooling can 21 is provided with the ion cleaning electrode 22 and the first patterning unit, that is, the first EL pattern vapor deposition unit B. The ITO-patterned substrate 1 has its surface cleaned at the ion cleaning electrode 22 as the preprocessing before vapor deposition of the organic luminescent layer. After cleaning, the stripe pattern 5 of GREEN, which is the first luminescent layer pattern, is formed at the first EL pattern vapor deposition unit B.

The operation of the first EL pattern vapor deposition unit B will now be described. The substrate 1 having the electrode patterns 4 formed thereon is continuously reeled out from the reeling shaft 11, and the edges 4a of the electrode patterns 4 are detected by the anode pattern edge detection sensor 27. The travelling distance of the substrate 1 is counted by the counter 12 and the travelling position of the edges 4a is detected. At a time point when the edges 4a are shifted to slightly before the opening portion 28a of the mask 28, the shutter 24 is opened by the operation of the shutter controller 25, and the deposition from the evaporation source 23 is vapor-deposited on the electrode patterns 4 of the substrate 1, thus forming the stripe pattern 5 of GREEN as shown in FIG. 2(b). The substrate 1 travels toward the second cooling can 44.

The operation of the luminescent layer pattern edge detection sensor 42 and the mask width position controller 45 will now be described. When the substrate 1 having its meandering in the direction of width corrected to a certain extent by the edge position controller 41 passes through the anode pattern edge detection sensor 27, the edge 4a is detected. Then, when the substrate 1 passes through the luminescent layer pattern edge detection sensor 42, the position of the previously formed stripe pattern 5 of GREEN in the direction of width is detected. The output signal of the detection sensor 42 is received by the mask width position controller 45.

The mask 28 is shifted and positioned in the direction of width of the substrate 1 by an actuator, not shown, and the position of the opening portion 28a in the direction of width is appropriately corrected in accordance with the position of the stripe pattern 5 of GREEN in the direction of width by an instruction from the mask width position controller 45. The edge 4a on the substrate 1 are already detected by the anode pattern edge detection sensor 27. When the edge 4a is located slightly before the opening portion 28a, the shutter 24 is opened by the operation of the shutter controller 25, and the deposition from the evaporation source 43 is vapor-deposited on the substrate 1, similarly to the operation of the vapor deposition unit 23, thus forming the stripe pattern 6 of BLUE as shown in FIG. 2(c). Similarly, in the third patterning unit D, the stripe pattern 7 of RED is formed on the substrate 1 as shown in FIG. 2(d).

Figure 3:
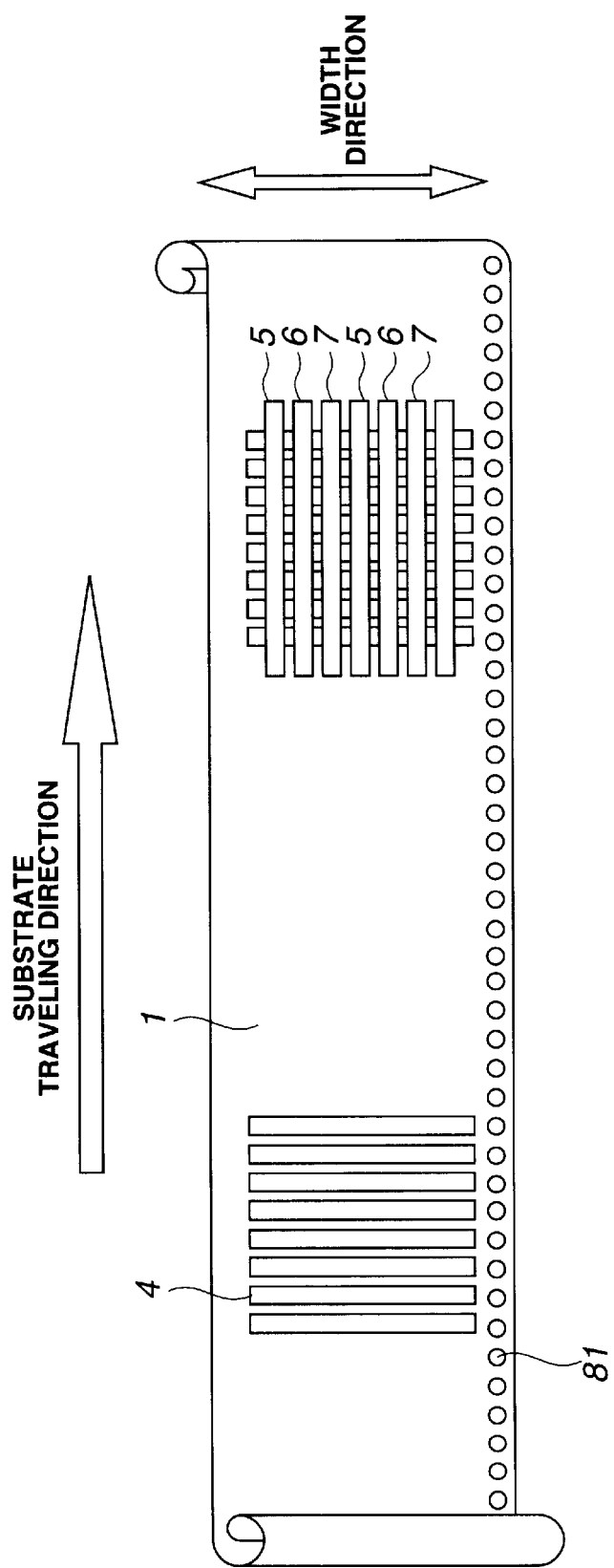
FIG. 3 shows a film substrate having a tracking signal formed at its one lateral end portion in the fabricating apparatus of FIG. 1.

In the above description, the alignment of the opening portion 28a in the direction of width may be carried out on the basis of a tracking signal provided on the substrate 1 for detection of the direction of width. Specifically, as shown in FIG. 3, a tracking signal 81 is provided in advance at one lateral end portion in the direction of width of the substrate 1, and a tracking signal detection sensor is provided in advanced at the position where the anode pattern edge detection sensor 27 is arranged or at a predetermined position preceding the opening portion 28a. The tracking signal 81 provided on the substrate 1 is detected by the tracking signal detection sensor, and the result of detection is sent to the mask width position controller 45. The mask width position controller 45 appropriately adjusts the position of the opening portion 28a in the direction of width in accordance with the position of the substrate 1 on the basis of the result of detection sent from the tracking signal detection sensor.

The above-described result of tracking signal detection can be used not only for alignment of the opening portion 28a in the direction of width but also for controlling the opening and closing timing of the shutter 24. That is, the above-described result of tracking signal detection is sent to the mask width position controller 45 and also sent to the shutter controller 25. The shutter controller 25 appropriately adjusts the opening and closing timing of the shutter 24 in accordance with the position of the substrate 1 on the basis of the result of detection sent from the tracking signal detection sensor.

In this case, for example, a magnetic tracking signal, an optical tracking signal, an electrostatic capacity tracking signal, or an electric tracking signal can be used as the tracking signal 81, which may be properly selected in consideration of various conditions such as the material of the substrate 1 and the manufacturing environment.

By thus carrying out the alignment of the opening portion 28a in the direction of width and the control of the opening and closing timing of the shutter 24, the position for forming the stripe pattern of the luminescent layer can be finely controlled in the direction of width and in the longitudinal direction of the substrate 1. The control of the pattern forming position is not limited to the formation of the stripe pattern of the luminescent layer and can be similarly applied to formation of the cathode pattern, which will be described later. Thus, it is possible to form an organic EL element of high quality.

At the fourth cooling can 64, the stipe pattern 8 of the cathode 8a (metal layer pattern) is formed on the stipe patterns 5, 6, and 7 of three colors (GREEN, BLUE, and RED) already formed on the substrate 1, similarly as shown in FIG. 2(e). Although the electrode pattern film forming unit 63 in FIG. 1 uses vapor deposition, it may also be based on sputtering.

Finally, the pattern-formed substrate 1 is wound by the winding shaft 71. In order to make an organic EL display, a step of forming an extended electrode and a sealing step are required. However, since the organic EL layer thus formed is generally easy to deteriorate, the film wound in a roll is housed in the $N_2$ purge box 72 and carried to the extended electrode forming step and the sealing step (not shown), which are subsequent steps.

Figure 2:
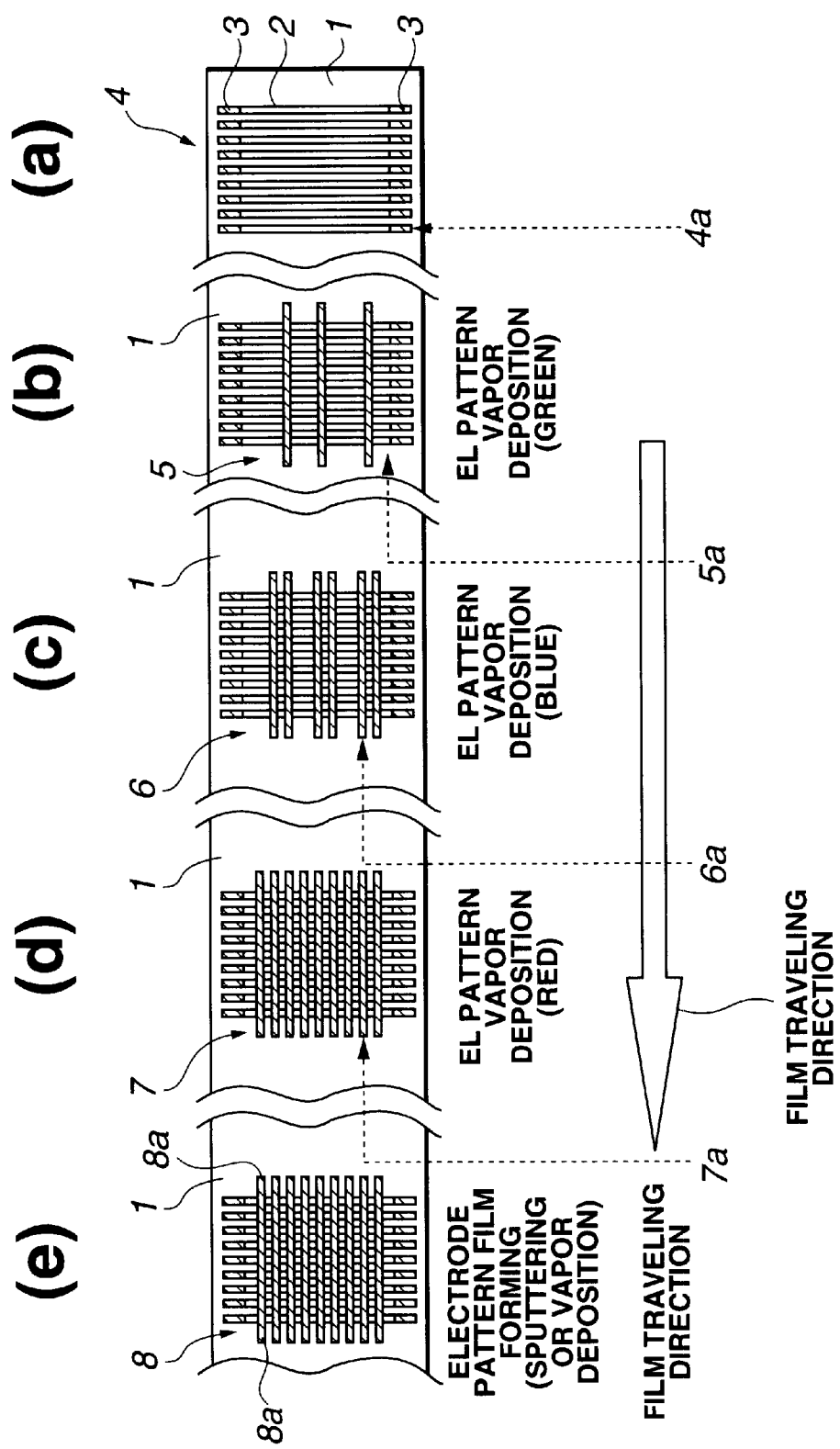
FIG. 2(a) is a plan view showing the state where respective patterns are sequentially formed on a film substrate in the fabricating apparatus of FIG. 1, and showing a substrate which has ITO anodes and extended electrodes patterned in a stripe form on the surface thereof in advance.
FIG. 2(b) is a plan view showing the state where respective patterns are sequentially formed on a film substrate in the fabricating apparatus of FIG. 1, and showing the substrate immediately after a luminescent layer of GREEN is patterned in a stripe form.
FIG. 2(c) is a plan view showing the state where respective patterns are sequentially formed on a film substrate in the fabricating apparatus of FIG. 1, and showing the substrate immediately after a luminescent layer of BLUE is patterned in a stripe form.
FIG. 2(d) is a plan view showing the state where respective patterns are sequentially formed on a film substrate in the fabricating apparatus of FIG. 1, and showing the substrate immediately after a luminescent layer of RED is patterned in a stripe form.
FIG. 2(e) is a plan view showing the state where respective patterns are sequentially formed on a film substrate in the fabricating apparatus of FIG. 1, and showing the substrate immediately after a cathode is patterned.

Although the apparatus according to the embodiment of FIG. 1 is constituted to carry out formation of patterns of the organic EL layer of three colors (GREEN, BLUE, and RED) and the cathode layer in accordance with the continuous in-line roll-to-roll system, pattern formation of each layer may also be carried out by an independent apparatus of the roll-to-roll system Moreover, the present invention is not limited to the fabrication of the organic EL display shown in FIG. 2. That is, though the display of FIG. 2 has the stripe patterns, other pattern shapes may also be used. For example, a dot-like pattern may be used. In the case of forming a dot-like pattern, it can be formed, for example, in the following manner.

Figure 4:
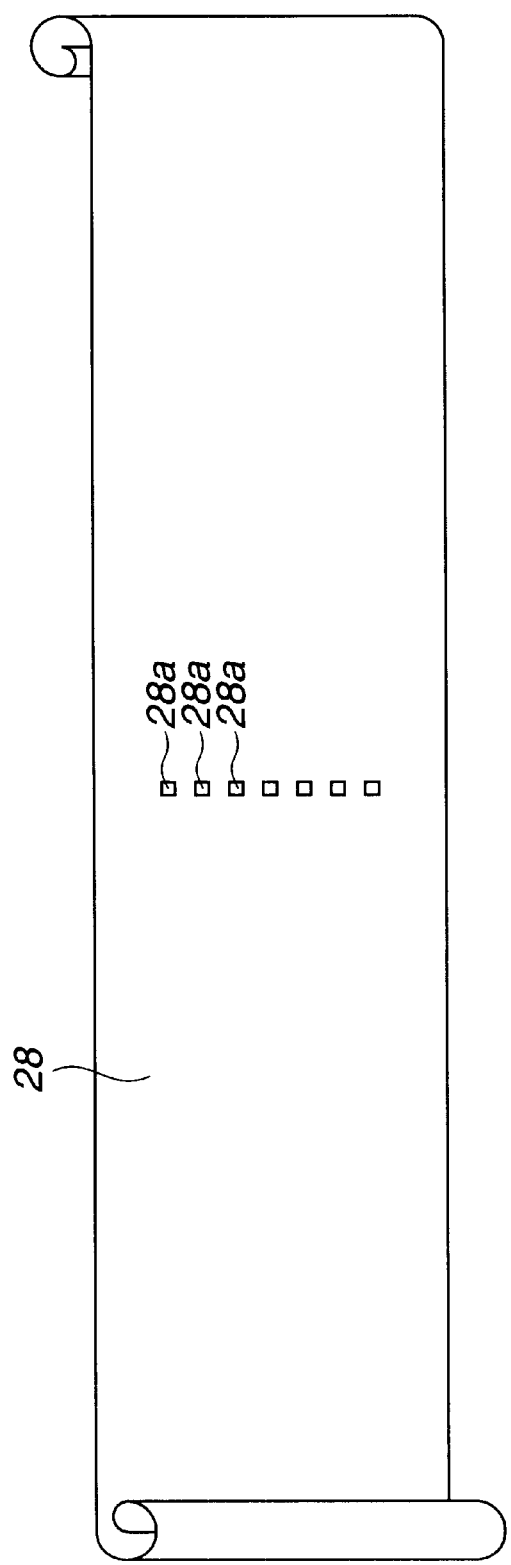
FIG. 4 shows an exemplary structure of a mask used for forming a dot-like pattern in the fabricating apparatus of FIG. 1.

Specifically, as shown in FIG. 4, the opening portion 28a of the mask is formed in a substantially square shape in the longitudinal direction of the substrate 1. Then, the substrate 1 is fed to index as shown in FIG. 5, and the substrate 1 is fixed so that a predetermined position of the substrate 1, that is, the position for forming the organic EL element, is aligned with the position corresponding to the opening portion 28a. The shutter 24 is opened in this state, then vapor deposition is carried out through the opening portion 28a to form a dot-like pattern 82, and then the shutter 24 is closed. Then, the substrate 1 is fed to index and the substrate 1 is fixed so that the position for forming the next dot-like pattern 82 is aligned with the opening portion 28a. The shutter 24 is opened, then vapor deposition is carried out through the opening portion 28a to form the dot-like pattern 82, and then the shutter 24 is closed. By repeating the above-described operation, the dot-like pattern 82 can be formed at the position for forming the organic EL element. Except for the above-described matter, the formation of the dot-like pattern can be carried out by using the same apparatus and method as those in the case of forming the stripe pattern.

Furthermore, the present invention is not limited to the full-color organic EL display and can be applied to a single-color display.

INDUSTRIAL APPLICABILITY

According to the present invention, the formation of an organic EL element on a flexible substrate such as a plastic film or the like in accordance with the roll-to-roll system, which is difficult in the conventional technique, is made possible, and it is possible to significantly lower the manufacturing cost of the organic EL display.

Also, according to the present invention, since the patterning of the cathode of the organic EL element and the organic EL medium layer is made possible in a vacuum integrated process of the roll-to-roll system, the problem of deterioration of the characteristics of the organic EL element due to mixture of impurity into the organic EL medium layer can be prevented, and continuous mass production of organic EL elements of high quality is made possible.

What is claimed is:

1. A method for fabricating a flexible organic EL display, having a cathode, at least one luminescent layer made of an organic substance, and an anode provided on an optically transparent substrate, wherein a flexible substrate strip made of a plastic film is used as the optically transparent substrate, and a step of patterning the luminescent layer and a step of patterning the cathode are carried out in a vacuum by a roll-to-roll system while making the flexible substrate travel continuously.

2. The method for fabricating a flexible organic EL display as claimed in claim 1, wherein the luminescent layer patterning step patterns the luminescent layer on the surface of the flexible substrate on which the anode is patterned in advance and the surface of the flexible substrate is cleaned by ion bombardment immediately before the luminescent layer patterning step.

3. The method for fabricating a flexible organic EL display as claimed in claim 1, wherein at least one of the luminescent layer patterning step and the cathode patterning step is carried out by vacuum vapor deposition or sputtering using a mask having an opening portion of a predetermined shape formed therein, and forms a stripe pattern having a width equal to the width of the opening portion on the flexible substrate.

4. The method for fabricating a flexible organic EL display as claimed in claim 3, wherein as the mask, a mask strip having opening portions intermittently formed therein is caused to intermittently travel by the roll-to-roll system at every predetermined travelling length of the flexible substrate in accordance with the roll-to-roll system, and wherein the opening portions which are reeled out are caused to face a generation source of a patterning substance in the luminescent layer patterning step and the cathode patterning step.

5. The method for fabricating a flexible organic EL display as claimed in claim 4, wherein a tracking signal is provided on one lateral end portion of the flexible substrate, the position in the longitudinal direction and the direction of the width of the flexible substrate is detected by detecting the tracking signal, and the position of the opening portion of the mask and the opening and closing timing of a shutter for starting and stopping the supply of the patterning substance to the flexible substrate are controlled on the basis of the result of detection.

6. The method for fabricating a flexible organic EL display as claimed in claim 1, wherein the flexible substrate processed in the luminescent layer patterning step and the cathode patterning step is wound in a roll shape and wherein the roll is housed in a container filled with an inert gas and is carried to a further processing step.

7. A method for fabricating a flexible organic EL display, having a cathode, at least one luminescent layer made of an organic substance, and an anode provided on an optically transparent substrate,
wherein a flexible substrate strip made of a plastic film is used as the optically transparent substrate, and a step of patterning the luminescent layer and a step of patterning the cathode are carried out in a vacuum by a roll-to-roll system while making the flexible substrate travel intermittently.

8. The method for fabricating a flexible organic EL display as claimed in claim 7, wherein the luminescent layer patterning step patterns the luminescent layer on the surface of the flexible substrate on which the anode is patterned in advance and the surface of the flexible substrate is cleaned by ion bombardment immediately before the luminescent layer patterning step.

9. The method for fabricating a flexible organic EL display as claimed in claim 7, wherein at least one of the luminescent layer patterning step and the cathode patterning step is carried out by vacuum vapor deposition or sputtering using a mask having an opening portion of a predetermined shape formed therein, and forms a dot pattern having a width equal to the width of the opening portion on the flexible substrate.

10. The method for fabricating a flexible organic EL display as claimed in claim 9, wherein as the mask, a mask strip having opening portions intermittently formed therein is caused to intermittently travel by the roll-to-roll system at every predetermined travelling length of the flexible substrate in accordance with the roll-to-roll system, and wherein the opening portions which are reeled out are caused to face a generation source of a patterning substance in the luminescent layer patterning step and the cathode patterning step.

11. The method for fabricating a flexible organic EL display as claimed in claim 10, wherein a tracking signal is provided on one lateral end portion of the flexible substrate, the position in the longitudinal direction and the direction of the width of the flexible substrate is detected by detecting the tracking signal, and the position of the opening portion of the mask and the opening and closing timing of a shutter for starting and stopping the supply of the patterning substance to the flexible substrate are controlled on the basis of the result of detection.

12. The method for fabricating a flexible organic EL display as claimed in claim 7, wherein the flexible substrate processed in the luminescent layer patterning step and the cathode patterning step is wound in a roll shape and wherein the roll is housed in a container filled with an inert gas and is carried to a further processing step.

13. An apparatus for fabricating a flexible organic EL display, adapted for fabricating an organic EL display having a cathode, at least one luminescent layer made of an organic substance, and an anode provided on an optically transparent flexible substrate made of a plastic film,
wherein a step of patterning the luminescent layer and a step of patterning the cathode onto the surface of an optically transparent flexible substrate strip are carried out in a vacuum by a roll-to-roll system while making the flexible substrate travel.

14. The apparatus for fabricating a flexible organic EL display as claimed in claim 13, wherein an ion cleaning electrode for cleaning the surface of the flexible substrate by ion bombardment immediately before the luminescent layer patterning step is provided.

15. The apparatus for fabricating a flexible organic EL display as claimed in claim 13, wherein at least one of the luminescent layer patterning step and the cathode patterning step is carried out by vacuum vapor deposition or sputtering using a mask, and wherein the apparatus comprises a continuously rotating drum, for winding the flexible substrate thereon and causing the flexible substrate to travel, a generation source of a patterning substance, and a mask arranged between the continuously rotating drum and the patterning substance generation source and having an opening portion of a predetermined shape formed therein.

16. The apparatus for fabricating a flexible organic EL display as claimed in claim 15, wherein the apparatus comprises travelling means for causing a mask strip having opening portions intermittently formed therein to intermittently travel by the roll-to-roll system at every predetermined travelling length of the flexible substrate in accordance with the roll-to-roll system, and wherein the opening portions reeled out by the travelling means are caused to face the generation source of the patterning substance.

17. The apparatus for fabricating a flexible organic EL display as claimed in claim 16, wherein the apparatus comprises a tracking signal provided on one lateral end portion of the flexible substrate and a tracking signal detection sensor for detecting the tracking signal, and
wherein the position in the longitudinal direction and the direction of the width of the flexible substrate is detected by detecting the tracking signal using the tracking signal detection sensor, and the position of the opening portion formed in the mask and the opening and closing timing of a shutter for starting and stopping the supply of the patterning substance to the flexible substrate are controlled on the basis of the result of detection.

18. The apparatus for fabricating a flexible organic EL display as claimed in claim 15, wherein a travelling counter for counting the travelling distance of the flexible substrate and an anode pattern edge detection sensor for detecting an edge of an anode stripe pattern are provided in the luminescent layer patterning step, and a shutter for starting and stopping the supply of the patterning substance to the flexible substrate and a shutter controller for controlling the opening and closing of the shutter are provided in the patterning substance generation source, and wherein the travelling counter and the anode pattern edge detection sensor are caused to communicate with the shutter controller, and patterning from a front end portion to a rear end portion of the anode stripe pattern along the substrate travelling direction is carried out by controlling the opening and closing of the shutter in the luminescent layer patterning step.

19. The apparatus for fabricating a flexible organic EL display as claimed in claim 15, wherein in the luminescent layer patterning step for forming a luminescent layer pattern of another color in parallel with and distanced away at an appropriate space from a luminescent layer pattern in the flexible substrate having an anode stripe pattern formed in the direction of width of the flexible substrate and having the luminescent layer pattern of a predetermined color orthogonal to the anode pattern, or in the cathode patterning step for stacking a stripe pattern of a cathode on luminescent layer stripe patterns in the flexible substrate having the anode stripe pattern formed in the direction of width of the flexible substrate and having the luminescent layer stripe patterns of predetermined colors formed on the anode pattern, a travelling counter for counting the travelling distance of the flexible substrate, an anode pattern edge detection sensor for detecting an edge of the anode stripe pattern, luminescent layer pattern edge detection sensors for detecting edges of the luminescent layer patterns, a mask width position controller for adjusting the position of a mask in the direction of width of the flexible substrate, and an edge position controller for correcting meandering of the flexible substrate on the continuously rotating drum are provided, and wherein the anode pattern edge detection sensor is caused to communicate with a shutter controller, the travelling counter is caused to communicate with the shutter controller and the mask width position controller, and the luminescent layer pattern edge detection sensors are caused to communicate with the mask width position controller, and wherein a shutter for starting and stopping the supply of the patterning substance to the flexible substrate, and the shutter controller for controlling the opening and closing of the shutter are provided in the patterning substance generation source.

20. The apparatus for fabricating a flexible organic EL display as claimed in claim 13, wherein the apparatus comprises winding means for winding in a roll the flexible substrate processed in the luminescent layer patterning step and the cathode patterning step, and a container filled with an inert gas for housing the roll.

* * * * *

UNITED STATES PATENT AND TRADEMARK OFFICE
CERTIFICATE OF CORRECTION

PATENT NO. : 6,579,422 B1
DATED : June 17, 2003
INVENTOR(S) : Masayasu Kakinuma

It is certified that error appears in the above-identified patent and that said Letters Patent is hereby corrected as shown below:

<u>Title page, Item [54] and Column 1, lines 1-3,</u>
Title, replace "METHOD AND APPARATUS FOR MANUFACTURING FLEXIBLE ORGANIC EL DISPLAY" with -- METHOD AND APPARATUS FOR FABRICATING FLEXIBLE ORGANIC EL DISPLAY --

Signed and Sealed this

Eighteenth Day of November, 2003

JAMES E. ROGAN
*Director of the United States Patent and Trademark Office*